(12) United States Patent
Lopez et al.

(10) Patent No.: US 12,415,431 B2
(45) Date of Patent: Sep. 16, 2025

(54) AUXILIARY STATION COOLING UNIT FOR DC FASTER CHARGE

(71) Applicant: GM Global Technology Operations LLC, Detroit, MI (US)

(72) Inventors: Richard J. Lopez, Bloomfield Hills, MI (US); Srinivasa Rao Vaddiraju, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 784 days.

(21) Appl. No.: 17/715,593

(22) Filed: Apr. 7, 2022

(65) Prior Publication Data

US 2023/0322106 A1    Oct. 12, 2023

(51) Int. Cl.
*B60L 53/302* (2019.01)
*B60L 53/16* (2019.01)
*B60L 53/31* (2019.01)
*H05K 7/20* (2006.01)

(52) U.S. Cl.
CPC ............. *B60L 53/302* (2019.02); *B60L 53/16* (2019.02); *B60L 53/31* (2019.02); *H05K 7/20936* (2013.01)

(58) Field of Classification Search
CPC .... B60L 53/302; B60L 53/16; H05K 7/20936
USPC ........................................................ 320/109
See application file for complete search history.

(56) References Cited

U.S. PATENT DOCUMENTS

| | | | |
|---|---|---|---|
| 11,590,855 B2* | 2/2023 | Wainwright | B60L 58/26 |
| 12,054,031 B2* | 8/2024 | Oh | B60L 58/26 |
| 2012/0043943 A1* | 2/2012 | Dyer | B60L 53/14 320/160 |
| 2015/0306974 A1* | 10/2015 | Mardall | H01M 10/625 429/120 |
| 2019/0255961 A1* | 8/2019 | Heyne | B60L 53/302 |
| 2020/0338998 A1* | 10/2020 | Wainwright | B60L 58/26 |
| 2020/0343610 A1* | 10/2020 | Agathocleous | H01M 10/44 |
| 2023/0065903 A1* | 3/2023 | Oh | B60H 1/143 |
| 2024/0343142 A1* | 10/2024 | Wang | B60L 53/11 |

* cited by examiner

*Primary Examiner* — Jack Chiang
*Assistant Examiner* — Suchin Parihar
(74) *Attorney, Agent, or Firm* — CANTOR COLBURN LLP

(57) ABSTRACT

A charging station for a vehicle, a system and a method of charging the vehicle. The system includes a heat exchanger at the vehicle. The charging station includes a reservoir including a charging station coolant, a dispenser unit configured to circulate the charging station coolant from the reservoir through the vehicle to absorb heat generated at the vehicle, and a cooling unit for cooling the charging station coolant from the reservoir. Heat generated during the charging of the vehicle is transferred into a vehicle coolant circulating within the vehicle. The heat is transferred from the vehicle coolant to a charging station coolant. The charging station coolant is flowed out of the vehicle.

20 Claims, 8 Drawing Sheets

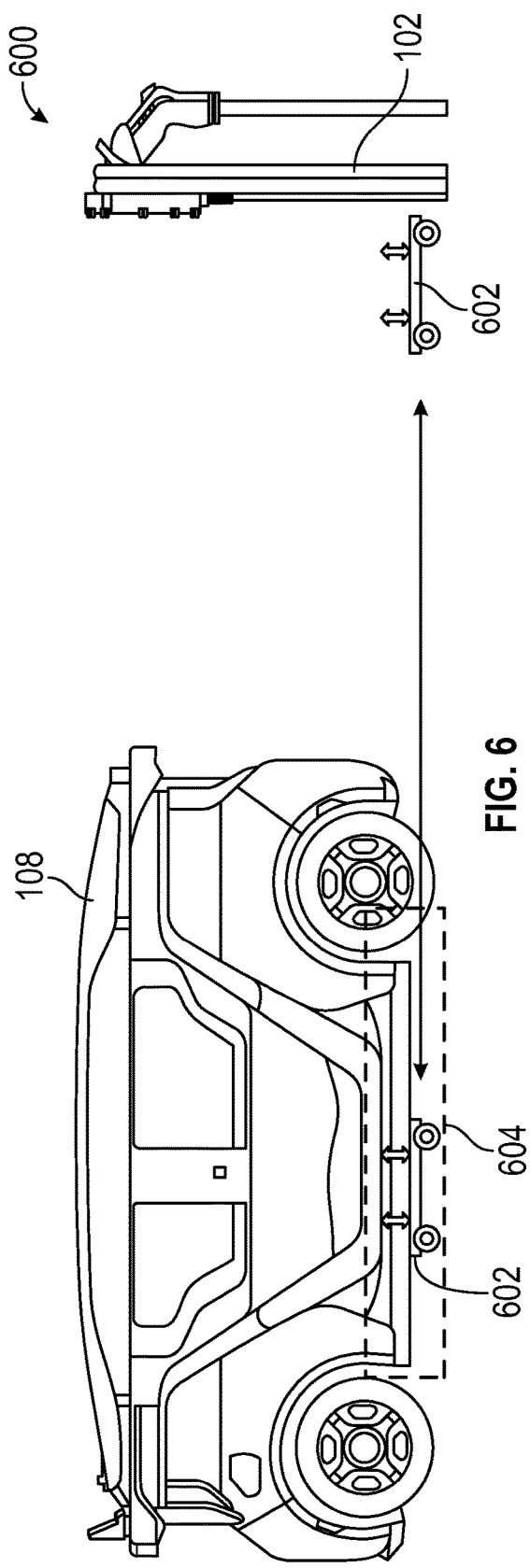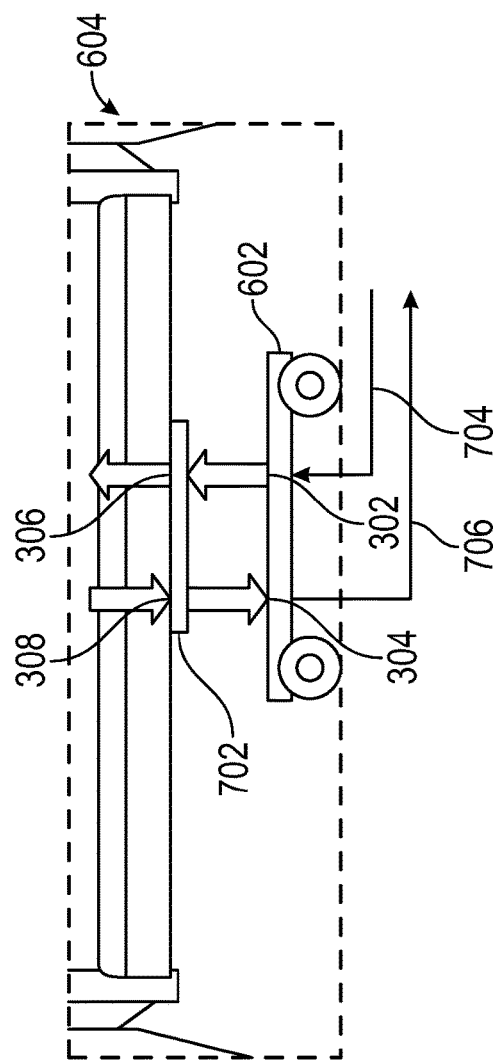

AUXILIARY STATION COOLING UNIT FOR DC FASTER CHARGE

INTRODUCTION

The subject disclosure relates to charging an electrical vehicle and, in particular, to a system and method for dispersing heat generated during the charging of the vehicle.

Electric vehicles run off of batteries that need to be charged once their energy is depleted. Charging a battery generates an amount of heat directly related to the rate at which the charging occurs. Without heat mitigation, the charging process can lead to thermal runaway. In order to reduce charging times, there is a desire to increase charging rates leading to higher charging temperatures. Accordingly, it is desirable to provide a method of maintaining the temperature of the battery below a runaway temperate limit during a charging process.

SUMMARY

In one exemplary embodiment, a method of charging a vehicle is disclosed. Heat generated during the charging of the vehicle is transferred into a vehicle coolant circulating within the vehicle. The heat is transferred from the vehicle coolant to a charging station coolant. The charging station coolant is flowed out of the vehicle.

In addition to one or more of the features described herein, the method further includes flowing the charging station coolant in a coolant circulation loop that includes a cooling unit outside of the vehicle. The method further includes storing the charging station coolant at an underground reservoir for ambient cooling. The method further includes coupling a hose to the vehicle, the hose including a connector having a first port and a second port, flowing the charging station coolant into the vehicle via the first port, and flowing the charging station coolant out of the vehicle through the second port. The method further includes switching a configuration of a valve of an internal circulation circuit of the vehicle when the hose is connected to the vehicle. Switching the configuration includes placing a heat exchanger in the internal circulation circuit to allow the heat to transfer from the vehicle coolant to the charging station coolant at the heat exchanger. The method further includes cooling the charging station coolant via one of circulating the charging station coolant through a radiator exterior to the vehicle and transferring the heat from the charging station coolant to a secondary coolant.

In another exemplary embodiment, a charging station for a vehicle is disclosed. The charging station includes a reservoir including a charging station coolant, a dispenser unit configured to circulate the charging station coolant from the reservoir through the vehicle to absorb heat generated at the vehicle, and a cooling unit for cooling the charging station coolant from the reservoir.

In addition to one or more of the features described herein, the cooling unit is located outside of the vehicle. The reservoir is underground. The charging station further includes a hose for coupling the dispenser unit to the vehicle, the hose including a connector with a first port for flowing the charging station coolant into the vehicle and a second port for flowing the charging station coolant out of the vehicle. The charging station further includes an electronic control unit configured to send a command to a valve of an internal circulation circuit of the vehicle when the hose is connected to the vehicle to switch a configuration of the valve. Switching the configuration of the valve includes placing a heat exchanger in the internal circulation circuit to allow the heat from the vehicle coolant to be transferred to the charging station coolant at the heat exchanger. The cooling unit further includes at least one of a radiator for cooling the charging station coolant from the reservoir and a condenser for cooling a secondary coolant, the secondary coolant absorbing heat from the charging station coolant.

In yet another exemplary embodiment, a system for charging a battery of a vehicle is disclosed. The system includes a heat exchanger at the vehicle, a reservoir exterior to the vehicle, the reservoir including a charging station coolant, a dispenser unit configured to circulate the charging station coolant from the reservoir through the vehicle to absorb heat generated at the vehicle, and a cooling unit for cooling the charging station coolant from the reservoir.

In addition to one or more of the features described herein, the reservoir is underground. The system further includes a hose for coupling the dispenser unit to the vehicle, the hose including a connector with a first port for flowing the charging station coolant into the vehicle and a second port for flowing the charging station coolant out of the vehicle. The system further includes an electronic control unit configured to send a command to a valve of an internal circulation circuit of the vehicle when the hose is connected to the vehicle to switch a configuration of the valve. Switching the configuration of the valve includes placing the heat exchanger in the internal circulation circuit to allow the heat from the vehicle coolant to be transferred to the charging station coolant at the heat exchanger. The cooling unit further includes at least one of a radiator for cooling the charging station coolant from the reservoir and a condenser for cooling a secondary coolant, the secondary coolant absorbing heat from the charging station coolant.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which:

FIG. 6 shows a charging station in an alternate embodiment;

FIG. 7 shows a close-up view of a bottom section of the vehicle;

DETAILED DESCRIPTION

Figure 1:
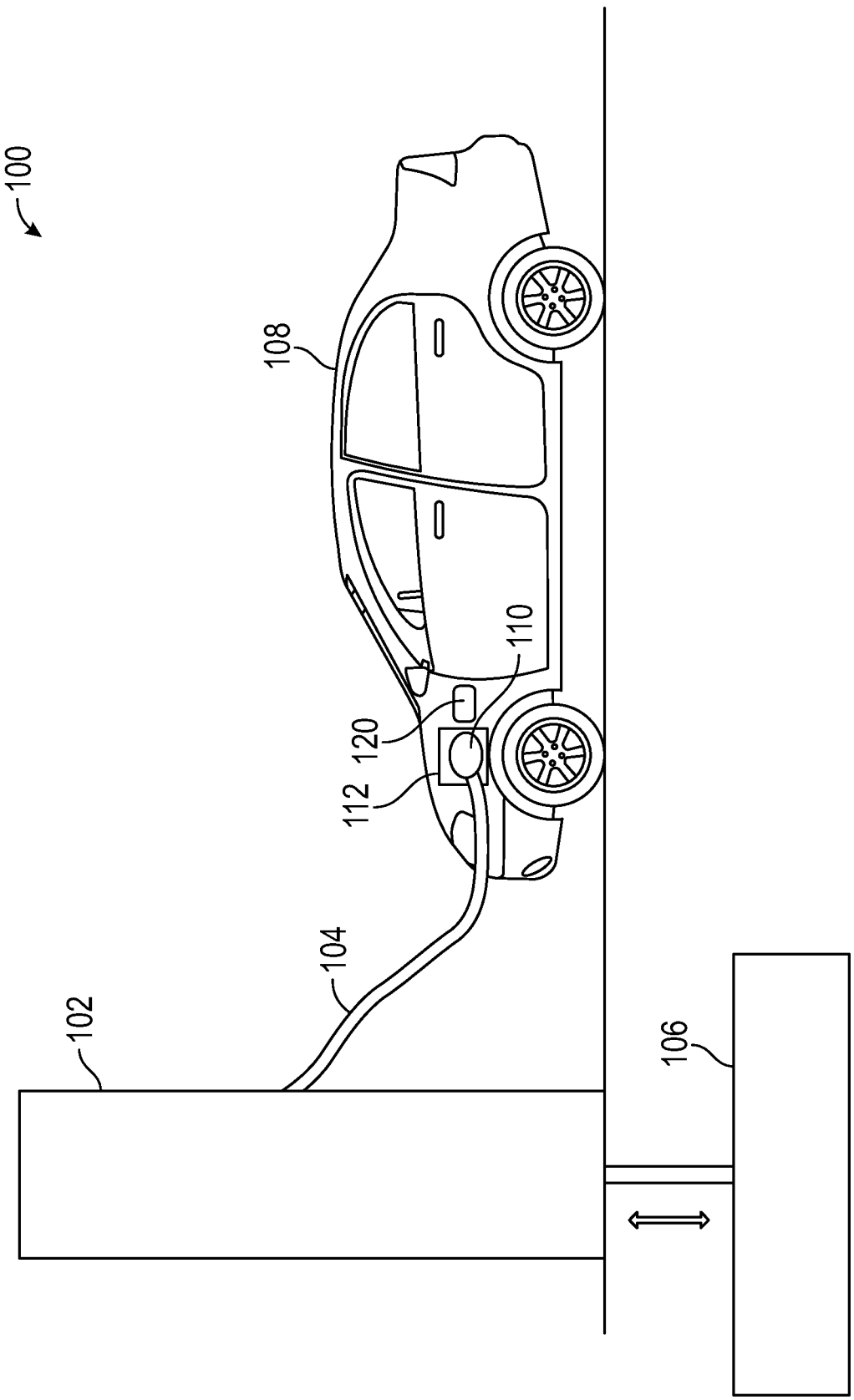
FIG. 1 shows a charging station, in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with an exemplary embodiment, FIG. 1 shows a charging station 100. The charging station 100 includes a dispenser unit 102 and a hose 104 extending from the dispenser unit 102. A reservoir 106 storing a charging station coolant is located at the charging station 100. In various embodiments, the reservoir 106 is an underground reservoir. The dispenser unit 102 circulates cold charging station coolant from the reservoir 106 via the hose 104 into a vehicle 108 parked at the charging station 100. The charging station coolant from the charging station 100 is delivered to a liquid-to-liquid heat exchanger 120. The charging station coolant absorbs heat generated during charging of the vehicle's battery. The hot charging station coolant is then circulated from the vehicle 108 back to the reservoir 106 via the hose 104 and dispenser unit 102, where it is cooled.

The hose 104 includes a connector 110 at one end, which can include a non-spill connector. The vehicle 108 has a dock 112 for receiving the connector 110. The connector 110 is placed in the dock 112 so that the charging station coolant can circulate through the vehicle 108 heat exchanger 120 to cool the battery as it is being charged. Although not shown in FIG. 1, the charging station 100 also includes a charging unit and a charging cable for charging the battery of the vehicle 108. In various embodiments, the charging cable and the hose 104 can be combined into a single hose assembly.

Figure 2:
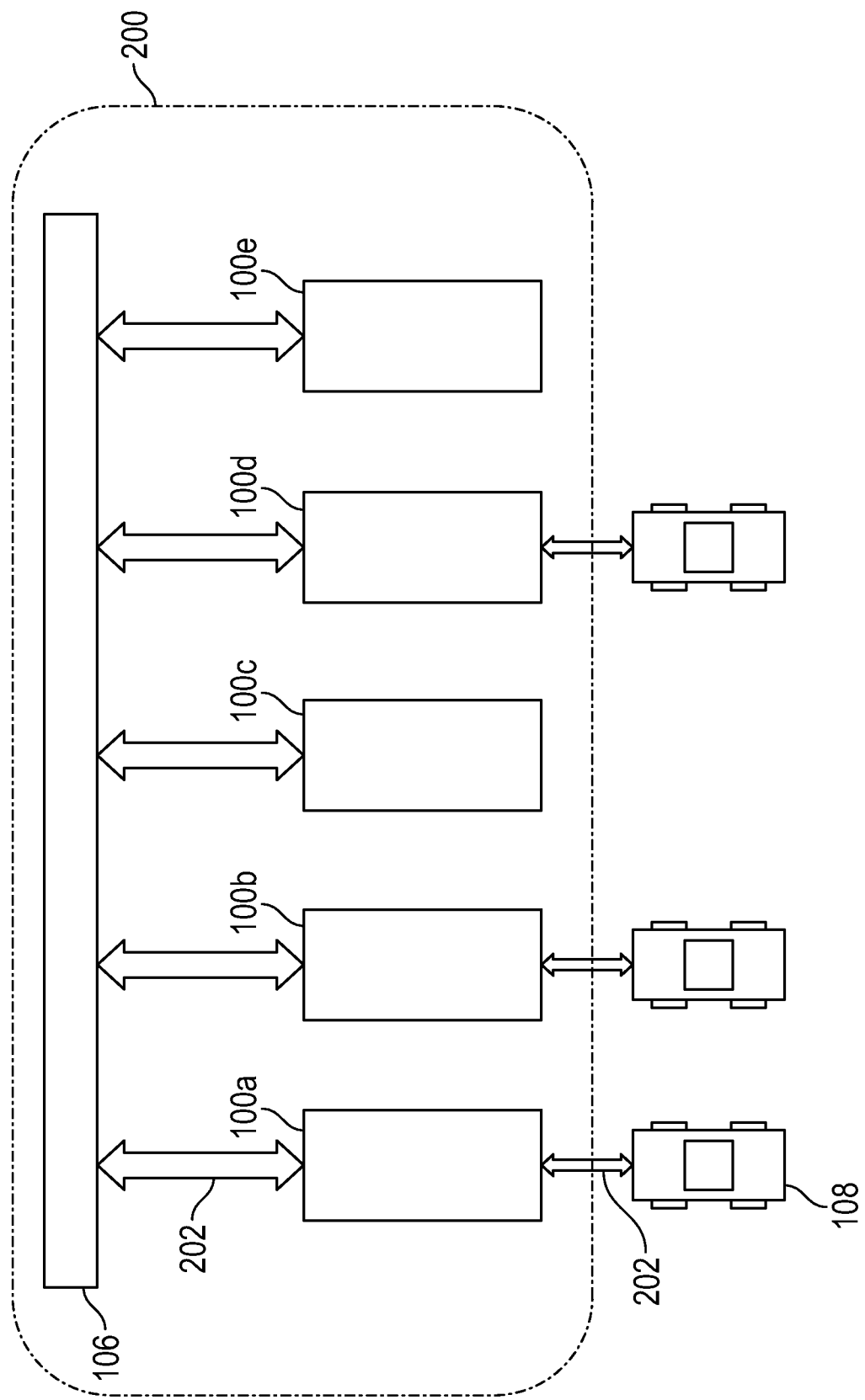
FIG. 2 shows a charging park including a plurality of charging stations, in an embodiment.

FIG. 2 shows a charging park 200 including a plurality of charging stations 100a-100e, in an embodiment. A driver parks the vehicle 108 at a selected charging station (e.g., charging station 100a) and connects the charging cable and hose 104 (FIG. 1) to the vehicle for charging. During charging, charging station coolant 202 is circulated from the reservoir 106 to the vehicle 108 and back to the reservoir. Each charging station 100a-100e is in fluid communication with the reservoir 106. Thus, the charging station coolant can be shared from the reservoir 106 to any of the charging stations 100a-100e.

Figure 3:
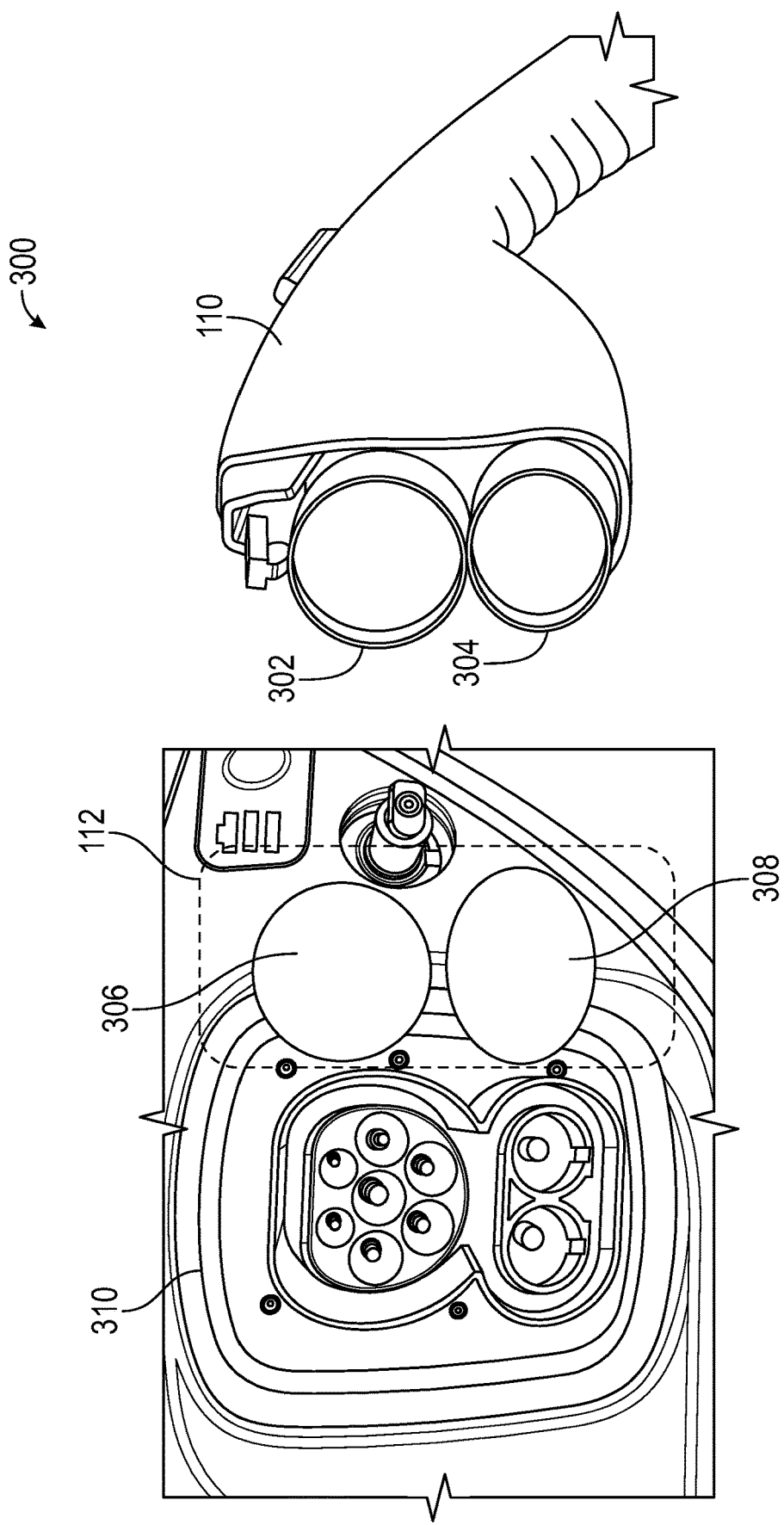
FIG. 3 shows a close-up view of a connector of a dispenser unit of the charging station and a dock of a vehicle.

FIG. 3 shows a close-up view 300 of the connector 110 of the dispenser unit 102 and the dock 112 of the vehicle 108. The connector 110 includes a first port 302 and a second port 304. The dock 112 includes an input socket 306 and an output socket 308. When the connector 110 is connected to the dock 112, the first port 302 is inserted into the input socket 306 to form a sealed inflow passage and the second port 304 is inserted into the output socket 308 to form a sealed outflow passage. Charging station coolant 202 flows into the vehicle 108 via the first port 302 and the input socket 306 and flows out of the vehicle via the output socket 308 and the second port 304. In various embodiments, the dock 112 can be located near a charging dock 310 that receives a charging cable.

Figure 4:
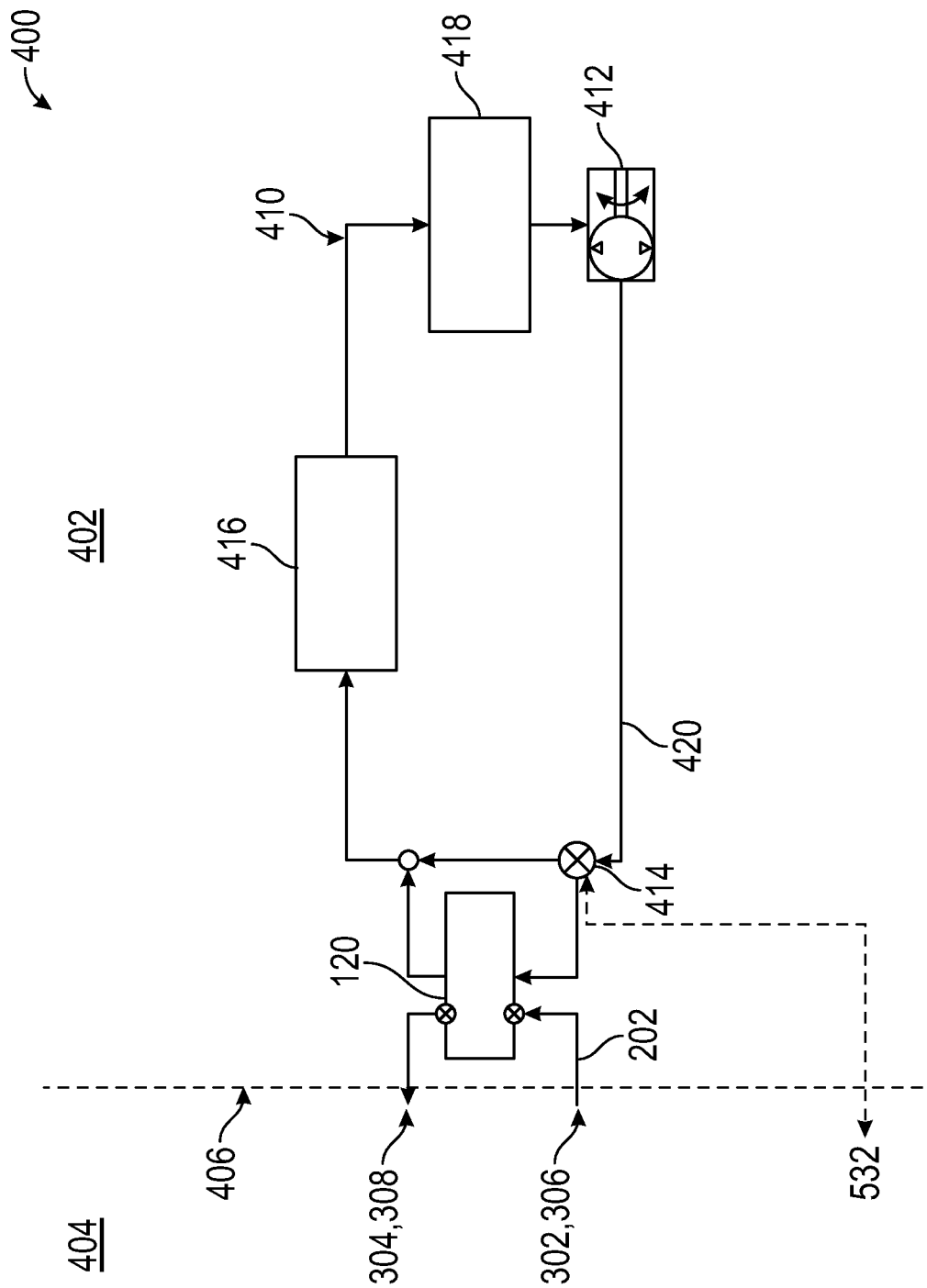
FIG. 4 shows a schematic view of a cooling system of the vehicle, in an embodiment.

FIG. 4 shows a schematic view 400 of a cooling system of the vehicle 108, in an embodiment. The schematic view 400 shows an interior region 402 that lies within or is on the vehicle 108 and an exterior region 404 that lies outside of the vehicle. Partition 406 shows a location at which the connector 110 is plugged into the dock 112. The location at which charging station coolant 202 enters the vehicle 108 is indicated by the first port 302 and the input socket 306 and the location at which coolant exits the vehicle is indicated by second port 304 and the output socket 308. The charging station coolant 202 enters the vehicle 108 at a cold temperature (e.g., 20 degrees Celsius). The coolant 202 passes through the heat exchanger 120 and exits the vehicle 108 at a high temperature (e.g., 30 degrees Celsius) upon absorbing energy from a vehicle coolant 420. The heat exchanger 120 is located inside or at the vehicle 108.

The interior region 402 includes an internal coolant circuit 410. The internal coolant circuit 410 includes a pump 412, a valve 414, a chiller 416, and a rechargeable energy storage system (RESS), such as a battery 418. A vehicle coolant 420 is circulated through the internal coolant circuit 410 via the pump 412. The valve 414 can be switched between a first configuration and a second configuration. In the first configuration, the internal coolant circuit 410 includes the pump 412, the valve 414, the chiller 416, and the battery 418. In the first configuration, only the chiller 416 is used to cool the vehicle coolant 420. In the second configuration, the internal coolant circuit 410 includes the pump 412, the valve 414, the chiller 416, the battery 418 and the heat exchanger 120. The valve 414 is switched to the second configuration during a charging process for the battery to include use of the heat exchanger 120.

The valve 414 can be switched from the first configuration to the second configuration when the connector 110 is coupled to the dock 112. Removing the connector 110 from the dock 112 switches the valve 414 back to the first configuration. In one embodiment, the connector 110 applies a force on the valve 414 when it is placed in the dock 112 to mechanically switch the valve from the first configuration to the second configuration. Removing the connector 110 removes the force, thereby allowing the valve to switch back to the first configuration. In another embodiment, the valve 414 can switch to the second configuration upon receiving an electronic signal that is transmitted by the connector 110. This signal can be transmitted when the connector 110 is secured to the dock 112 or when the connector 110 within a selected distance of the dock 112 and/or valve 414.

In the first configuration of the valve 414, the vehicle coolant 420 is circulated between the battery 418 and the chiller 416 to cool the battery during general operation of the vehicle. When the valve 414 is in the second configuration, the vehicle coolant 420 passes through heat exchanger 120. The heat generated at the battery 418 during charging is carried via the vehicle coolant 420 to the heat exchanger 120 where it is transferred to the charge station coolant 202. The charge station coolant 202 is then circulated out of the vehicle 108, thereby removing the heat from the battery 418 and maintaining the battery 418 at a temperature low enough to prevent overheating (i.e., below a battery runaway temperature).

Figure 5:
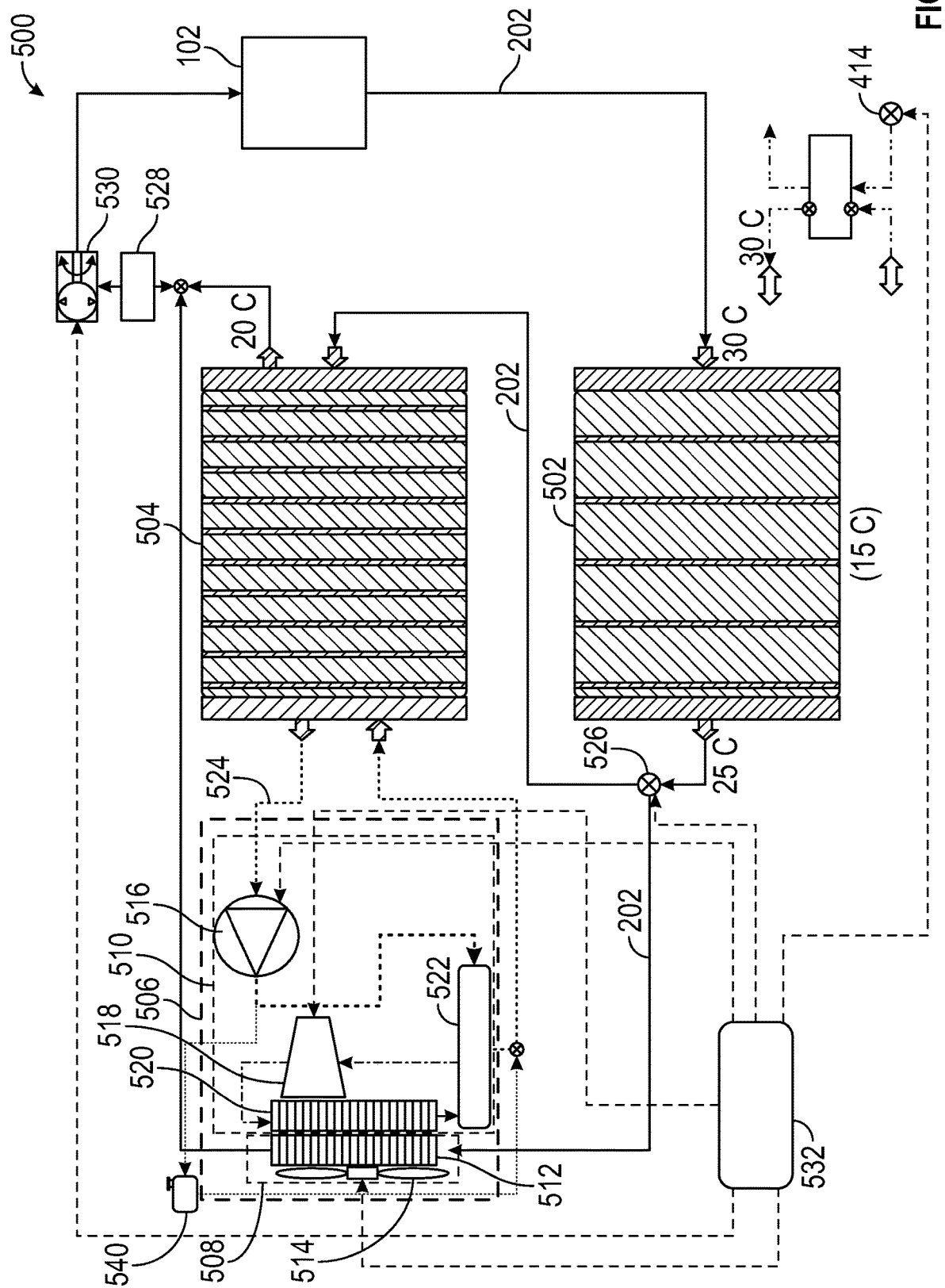
FIG. 5 shows a coolant circulation loop of the charging station, in an embodiment.

FIG. 5 shows a coolant circulation loop 500 of the charging station 100, in an embodiment. The coolant circulation loop 500 includes an un-insulated underground reservoir 502, an insulated reservoir 504, and a cooling unit 506. The charging station coolant 202 returning from the vehicle 108 is deposited into the un-insulated underground reservoir 502, where its temperature stabilizes to the temperature of the ground. From the un-insulated underground reservoir 502, the charging station coolant 202 is circulated to either the cooling unit 506 or the insulated reservoir 504 for additional cooling.

The cooling unit 506 includes a includes a first cooling system 508 and a second cooling system 510. The first cooling system 508 includes a radiator 512 and fan 514. The second cooling system 510 including a pump 516, a compressor 518, a condenser 520 and a chiller 522. The fan 514 can also be used in combination with the second cooling system 510. In one configuration, the charging station coolant 202 from the un-insulated underground reservoir 502 is circulated through the radiator 512 for cooling. The fan 514 blows ambient air over the radiator 512 in order to draw heat out of the charging station coolant 202. In another configuration, the charging station coolant 202 from the un-insulated underground reservoir 502 is circulated to the insulated reservoir 504 where the heat therein is transferred from the charging station coolant 202 to a secondary coolant 524. The secondary coolant 524 is then circulated from the insulated reservoir 504 through the second cooling system of the cooling unit 506, where it is cooled and then returned to the insulated reservoir 504. The fan 514 can be operated to facilitate condensation in the condenser 520.

In various embodiments, the secondary coolant 524 can be a phase change material. The phase change material is kept at cold temperature using the second cooling system 510. In an embodiment, the phase change material is ice/water and the second cooling system 510 maintains the water at about 0 degrees Celsius. The pump 516 circulates the secondary coolant 524 between the insulated reservoir and the second cooling system 510.

A coolant valve 526 in the coolant circulation loop 500 switches between a first configuration and a second configuration. In the first configuration, the charging station coolant 202 is directed from the un-insulated underground reservoir 502 to the first cooling system 508 of the cooling unit 506. At the cooling unit 506, the charging station coolant 202 passes through a radiator 512 where it is cooled. The charging station coolant 202 is then circulated back to the dispenser unit 102 and vehicle. The charging station coolant 202 passes through a filter 528 at the dispenser unit 102. A dispensing pump 530 at the dispenser unit 102 circulates the coolant 202 into the vehicle 108, FIG. 1.

In the second valve configuration, the charging station coolant 202 is directed from the un-insulated underground reservoir 502 to the insulated reservoir 504. At the insulated reservoir 504, the coolant 202 exchanges heat with a secondary coolant 524 for cooling. The coolant 202 is then send to the dispensing station, passing through the filter 528 and dispensing pump 530. Meanwhile, the secondary coolant 524 is pumped from the insulated reservoir 504 through the second cooling system 510, which maintains the temperature of the secondary coolant within a given range of temperatures. A surge tank 540 can be used to handle spillage within the second cooling system 510.

An electronic control unit 532 is in communication with various components of the coolant circulation loop 500, such as the fan 514, the compressor 518, the pump 516, the dispensing pump 530 and the valve 526. The electronic control unit 532 controls the operation of these components in order to maintain operation of the coolant circulation loop 500. For example, when the ambient temperature is less than a selected temperature, the valve 526 can be placed in a first configuration to direct the coolant to the radiator 512. When the ambient temperature is greater than or equal to the selected temperature, the valve 526 can be placed in a second configuration to circulate the coolant to the insulated reservoir 504. In various embodiments, the selected temperature is a room temperature (e.g., 25 degrees Celsius).

In various embodiments, the electronic control unit 532 is also in communication with the valve 414 of the refrigerant circulation loop 410 of the vehicle 108 and can send a control signal to the valve to changes its configuration.

FIG. 6 shows a charging station 600 in an alternate embodiment. The charging station 600 includes a dispenser unit 102 and a cart 602 which can be rolled underneath the vehicle 108 when the vehicle is parked at the charging station. A dock is located at a bottom section 604 of the vehicle 108 for fluid transfer.

FIG. 7 shows a close-up view 700 of the bottom section 604 of the vehicle 108. The bottom section 604 includes a door 702 that can be opened and closed to reveal or conceal the dock. The door 702 can be a sliding door in various embodiments.

A first hose 704 extends from the cart 602 to the dispenser unit 102 and a second hose 706 extends from the cart to the dispensing system. At the cart 602, the first hose 704 terminates in a first port 302 and the second hose terminates in a second port 304. The door 702 can be opened when the cart is underneath the vehicle 108 to expose an input socket 306 and an output socket 308. The cart 602 can be arranged so that the first port 302 can be sealingly coupled to the input socket 306 and the second port 304 can be sealingly coupled to the output socket 308. Coolant 202 can then be pumped from the reservoir (106, FIG. 1) into the vehicle 108 via the first hose 704, first port 302 and input socket 306. Coolant is removed from the vehicle 108 and sent to the reservoir (106, FIG. 1) via the output socket 308, second port 304 and the second hose 706.

Figure 8:
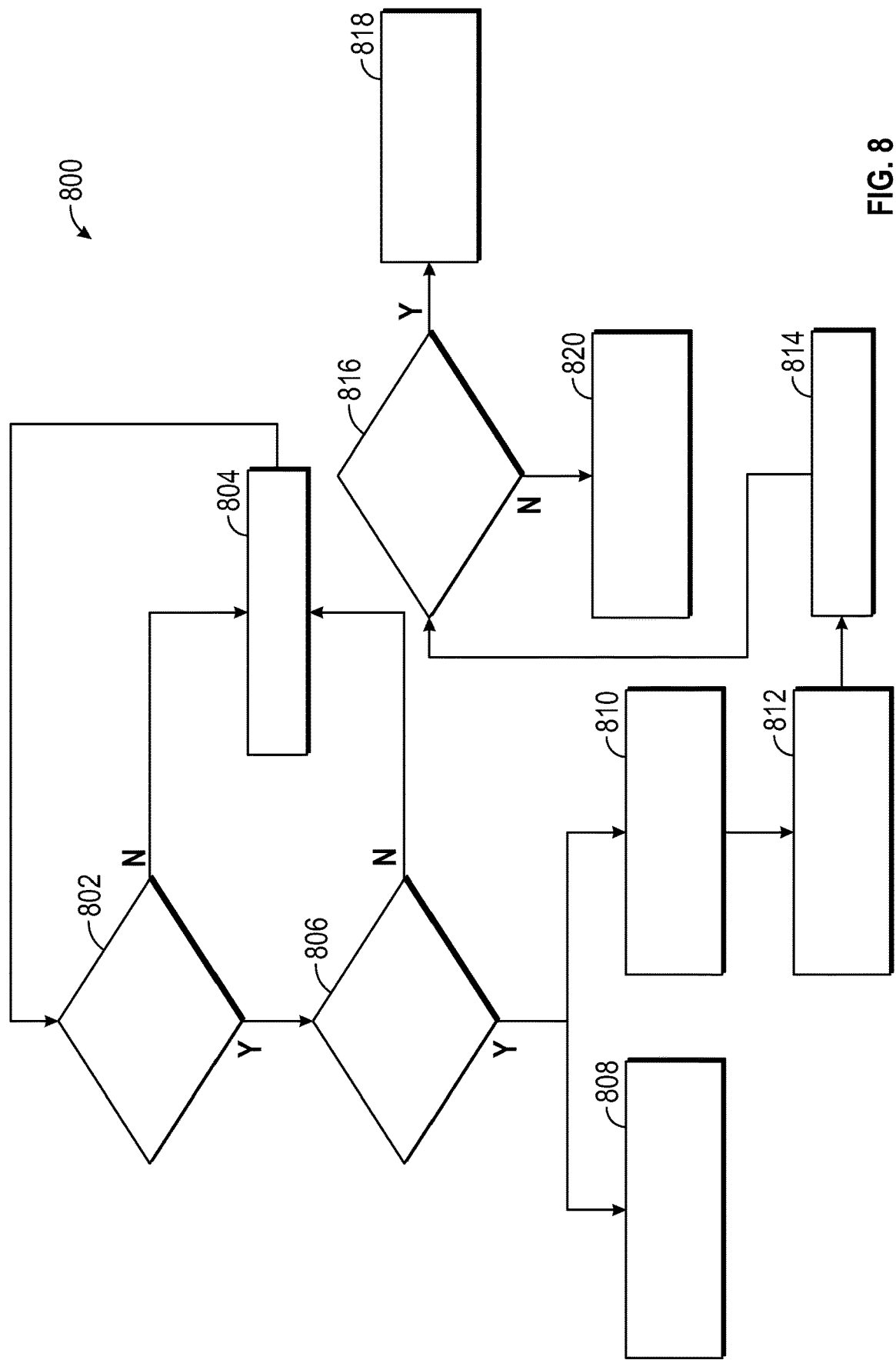
FIG. 8 shows a flowchart of a method for controlling a flow of a charging station coolant through the vehicle.

FIG. 8 shows a flowchart 800 of a method for controlling the flow of the charging station coolant 202 through the vehicle. In box 802, a test is performed to see if the coolant connector is connected to the vehicle. If the connector is not connected to the vehicle, the method proceeds to box 804. In box 804, no action is taken and the method returns to box 802. If at box 802, the connector is found to be connected to the vehicle, the method proceeds to box 806. In box 806, the temperature of the battery is measured. If the temperature is greater than an ambient temperature threshold (e.g., 25 degrees Celsius), the method proceeds to box 808 and box 810. In box 808, the valve 414 is placed into the second configuration to include the heat exchanger 120 in the internal coolant circuit. In box 810, a count is made of the number of vehicles that need cooling at the charging station. In box 812, the pump rate of the charging station coolant is adjusted to accommodate the number of vehicles that need cooling. In an embodiment, the number of charging vehicles n is multiplied by a standard pump rate for a single vehicle (e.g., 15 liters per minute) to obtain a combined pump rate (e.g., n*15 liters per minute).

In box 814, the fan of the charging station is turned on to initiate cooling of the charging station coolant. In box 816, the mode of operation for cooling the charging station coolant is selected. If the ambient temperature is less than the selected ambient temperature threshold (e.g., 25 degrees Celsius), then the method proceeds to box 818. Otherwise, the method proceeds to box 820.

In box 818, the coolant valve 526 is switched to the first configuration so that the charging station fluid 202 flows through the radiator. In box 820, the coolant valve 526 is switched to the second configuration so that the charging station fluid 202 flows through the insulated reservoir 504.

The charging station coolant 202 is therefore cooled based on the ability of the charging station to cool the charging station coolant 202 to the desired temperature. If there is adequate capacity for rejecting heat directly to the air, then the radiator cooling is selected. Otherwise, the use of the chiller is selected. This method of selection cooling methods optimizes the cooling process.

Figure 9:
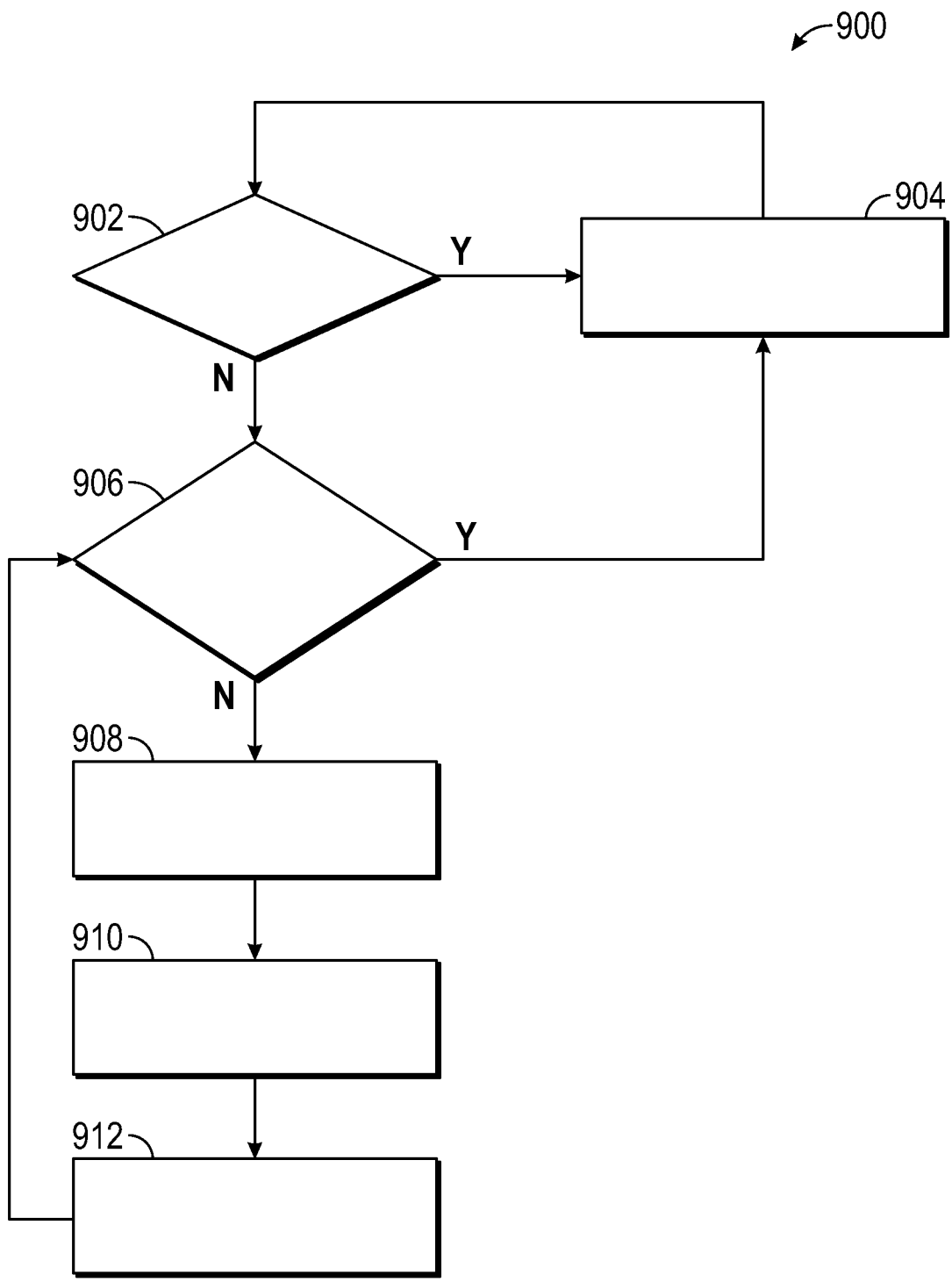
FIG. 9 shows a flowchart illustrating a method of cooling the charging station fluid.

FIG. 9 shows a flowchart 900 illustrating a method of cooling the charging station fluid. In box 902, a test is performed to determine the ambient temperature. If the ambient temperature is less than the ambient temperature threshold (e.g., 25 degrees Celsius), the method proceeds to box 904. At box 904, no action is taken and the method returns to box 902. If at box 902, the ambient temperature is greater than or equal to the ambient temperature threshold, the method proceeds to box 906. At box 906, a check is made on the temperature of the insulated reservoir or of the secondary coolant. If the temperature of the secondary coolant is less than a phase change temperature (e.g., 0 degrees Celsius), then the method proceeds to box 904 in which no action is taken. If, at box 906, the temperature of the secondary coolant is less than a phase change temperature, the method proceeds box 908. At box 908, the compressor is turned on. At box 910, the stationary fan is turned on. At box 912, the pump 516 is turned on to circulate the secondary coolant.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method of charging a vehicle, comprising:
    transferring a heat generated during the charging of the vehicle into a vehicle coolant circulating within the vehicle;
    transferring the heat from the vehicle coolant to a charging station coolant;
    flowing the charging station coolant out of the vehicle and into an underground reservoir associated with a charging station; and
    switching a coolant valve between a first configuration and a second configuration, wherein, in the first configuration, the coolant valve circulates the charging station coolant from the underground reservoir through a radiator for removal of the heat and, in the second configuration, the coolant valve circulates charging station coolant from the underground reservoir to an insulated reservoir for removal of the heat to a secondary coolant fluid stored in the insulated reservoir.

2. The method of claim 1, further comprising selecting between circulating the charging station coolant through the radiator circulating the charging station coolant to the insulated reservoir based on an ambient temperature.

3. The method of claim 2, wherein the charging station further comprises a fan coupled to the radiator and a condenser, further comprising using the fan to cool the charging station coolant at the radiator and to cool the secondary coolant fluid in the condenser.

4. The method of claim 1, further comprising
    coupling a hose to the vehicle, the hose including a connector having a first port and a second port;
    flowing the charging station coolant into the vehicle via the first port; and
    flowing the charging station coolant out of the vehicle through the second port.

5. The method of claim 4, further comprising switching a configuration of a valve of an internal circulation circuit of the vehicle when the hose is connected to the vehicle.

6. The method of claim 5, wherein switching the configuration includes placing a heat exchanger in the internal circulation circuit to allow the heat to transfer from the vehicle coolant to the charging station coolant at the heat exchanger.

7. The method of claim 1, further comprising cooling the vehicle coolant via a chiller in the vehicle.

8. A charging station for a vehicle, comprising:
    an underground reservoir including a charging station coolant;
    a dispenser unit configured to circulate the charging station coolant from the underground reservoir through the vehicle to absorb a heat generated at the vehicle; and
    a cooling unit for cooling the charging station coolant from the underground reservoir, the cooling unit including:
        a radiator;
        an insulated reservoir that stores a secondary coolant fluid; and
        a coolant valve switchable between a first configuration in which the coolant valve circulates the charging station coolant from the underground reservoir through a radiator removal of the heat and a second configuration in which the coolant valve circulates the cha tion coolant from the underground reservoir to an insulated reservoir for removal of the heat to the secondary coolant fluid stored in the insulate reservoir.

9. The charging station of claim 8, wherein the coolant valve is placed in one of the first configuration and the second configuration based on an ambient temperature.

10. The charging station of claim 9, wherein the cooling unit further comprises a fan coupled to the radiator and a condenser, wherein the fan cools the charging station coolant at the radiator and cools the secondary coolant fluid in the condenser.

11. The charging station of claim 8, further comprising a hose for coupling the dispenser unit to the vehicle, the hose including a connector with a first port for flowing the charging station coolant into the vehicle and a second port for flowing the charging station coolant out of the vehicle.

12. The charging station of claim 11, further comprising an electronic control unit configured to send a command to a valve of an internal circulation circuit of the vehicle when the hose is connected to the vehicle to switch a configuration of the valve.

13. The charging station of claim 12, wherein switching the configuration of the valve includes placing a heat exchanger in the internal circulation circuit to allow the heat from a vehicle coolant to be transferred to the charging station coolant at the heat exchanger.

14. The charging station of claim 8, wherein the charging station coolant is sent from one of the radiator and the insulated reservoir to the vehicle.

15. A system for charging a battery of a vehicle, comprising:
    a heat exchanger at the vehicle;
    an underground reservoir exterior to the vehicle, the underground reservoir including a charging station coolant;
    a dispenser unit configured to circulate the charging station coolant from the underground reservoir through the vehicle to absorb a heat generated at the vehicle; and
    a cooling unit for cooling the charging station coolant from the underground reservoir, the cooling unit including:
        a radiator;
        an insulated reservoir that stores a secondary coolant fluid; and a coolant valve switchable between a first configuration in which the coolant valve circulates the charging station coolant from the underground reservoir through a radiator for removal of the heat and a second configuration in which the coolant valve circulates the charging station coolant from the underground reservoir to an insulated reservoir for removal of the heat to the secondary coolant fluid stored in the insulated reservoir.

16. The system of claim 15, wherein the coolant valve is placed in one of the first configuration and the second configuration based on an ambient temperature.

17. The system of claim 15, further comprising a hose for coupling the dispenser unit to the vehicle, the hose including a connector with a first port for flowing the charging station coolant into the vehicle and a second port for flowing the charging station coolant out of the vehicle.

18. The system of claim 17, further comprising an electronic control unit configured to send a command to a valve of an internal circulation circuit of the vehicle when the hose is connected to the vehicle to switch a configuration of the valve.

19. The system of claim 18, wherein switching the configuration of the valve includes placing the heat exchanger in the internal circulation circuit to allow the heat from a vehicle coolant to be transferred to the charging station coolant at the heat exchanger.

20. The system of claim 15, wherein the charging station coolant is sent from one of the radiator and the insulated reservoir to the vehicle.

* * * * *